US006939758B2

(12) United States Patent
Yue et al.

(10) Patent No.: US 6,939,758 B2
(45) Date of Patent: Sep. 6, 2005

(54) GATE LENGTH CONTROL FOR SEMICONDUCTOR CHIP DESIGN

(75) Inventors: Cheisan J. Yue, Roseville, MN (US); Eric E. Vogt, Minneapolis, MN (US); Todd N. Handeland, New Hope, MN (US)

(73) Assignee: Honeywell International Inc., Morristown, NJ (US)

( * ) Notice: Subject to any disclaimer, the term of this patent is extended or adjusted under 35 U.S.C. 154(b) by 17 days.

(21) Appl. No.: 10/631,596

(22) Filed: Jul. 31, 2003

(65) Prior Publication Data

US 2004/0021157 A1 Feb. 5, 2004

Related U.S. Application Data

(62) Division of application No. 09/745,239, filed on Dec. 20, 2000, now Pat. No. 6,674,108.

(51) Int. Cl.[7] .................... H01L 21/302; H01L 21/8234

(52) U.S. Cl. ........................................ 438/238; 438/705

(58) Field of Search ................................ 438/197, 210, 438/213, 238, 666, 668, 674, 705, 714, 719, 753, 176, 195, 283, 592, 597

(56) References Cited

U.S. PATENT DOCUMENTS

| | | | | |
|---|---|---|---|---|
| 4,495,222 A | | 1/1985 | Anderson et al. | |
| 4,868,627 A | | 9/1989 | Yamada et al. | |
| 4,949,139 A | * | 8/1990 | Korsh et al. | 327/391 |
| 4,994,402 A | | 2/1991 | Chiu | |
| 5,470,775 A | | 11/1995 | Nariani | |
| 5,618,749 A | | 4/1997 | Takahashi et al. | |
| 6,261,883 B1 | | 7/2001 | Koubuchi et al. | |
| 6,297,109 B1 | | 10/2001 | Chan et al. | |
| 6,306,681 B1 | | 10/2001 | Ahn et al. | |
| 6,348,392 B1 | | 2/2002 | Nakayama et al. | |
| 2001/0052619 A1 | * | 12/2001 | Inoue et al. | 257/347 |
| 2002/0187440 A1 | * | 12/2002 | Kochi et al. | 430/394 |

FOREIGN PATENT DOCUMENTS

| | | |
|---|---|---|
| EP | 0 936 669 | 8/1999 |
| JP | 57 180138 | 11/1982 |
| JP | 63 - 67749 | 3/1988 |
| JP | 63 - 127575 | 5/1988 |
| JP | 2 - 105532 | 4/1990 |
| JP | 10 335333 | 12/1998 |
| JP | 2000 - 112114 | 4/2000 |

* cited by examiner

*Primary Examiner*—Craig A. Thompson
*Assistant Examiner*—Jennifer M Dolan
(74) *Attorney, Agent, or Firm*—Schiff Hardin LLP

(57) ABSTRACT

A semiconductor device includes first and second polysilicon areas on a chip. The first polysilicon area corresponds to circuit elements of the semiconductor device. At least some of the first polysilicon corresponds to polysilicon gates. At least some of the second polysilicon area comprises contacts of the semiconductor device. Metal covers the polysilicon contacts.

18 Claims, 8 Drawing Sheets

15 SCCM HE/02 100% OE

GATE LENGTH CONTROL FOR SEMICONDUCTOR CHIP DESIGN

CROSS-REFERENCE TO RELATED APPLICATION

This is a Divisional application of Ser. No. 09/745,239, filed Dec. 20, 2000 now U.S. Pat. No. 6,674,108.

TECHNICAL FIELD OF THE INVENTION

The present invention relates to the design of semiconductor chips such as RF switches.

BACKGROUND OF THE INVENTION AND PRIOR ART

CMOS device performance is affected, often critically, by dimension control of the device's gate length. A manufacturable gate definition process includes both gate patterning and etching. For example, while it is generally desirable to use as little polysilicon as possible in the formation of the gates of RF CMOS devices, the typical polysilicon etch process used in the formation of such CMOS devices requires the use of more polysilicon than is desired for these gates.

That is, gate etching is sensitive to the "micro-loading" effect. Micro-loading is usually defined as the utilization of the chip area between the gate and the chip. Micro-loading is generally not a concern for typical LSI circuits which have ratios of 10% or more of gate area to total chip area. However, for certain types of applications, such as RF switches, which demand both extremely high performance and a limited gate area, a significant adjustment of the gate etch chemistry or bias condition is usually exploited because of the need for a low gate area.

The present invention permits the use of conventional gate etch processes by placing polysilicon pads underneath probe pads during chip layout. Accordingly, the overall ratio of polysilicon to chip area can be increased so that conventional gate etching processes can be used, while the ratio of gate polysilicon to chip area can be kept small for better device operation. In addition, by increasing the polysilicon area in the chip layout, the gate etch process margin for deep sub-micron applications is improved.

SUMMARY OF THE INVENTION

In accordance with one aspect of the present invention, a semiconductor device comprises first and second polysilicon and metal pads. The first polysilicon forms circuit elements of the semiconductor device on a chip, and at least some of the circuit elements comprise polysilicon gates. The second polysilicon forms polysilicon pads of the semiconductor device on the chip. The metal pads cover the polysilicon pads.

In accordance with another aspect of the present invention, a semiconductor device chip comprises first, second, and third transistors, a plurality of polysilicon resistors, a plurality of polysilicon pads, and contacts. The first transistor comprises gate regions and alternating source and drain regions. Each gate region of the first transistor is between a pair of adjacent source and drain regions, and each gate region of the first transistor comprises polysilicon. The second transistor comprises gate regions and alternating source and drain regions. Each gate region of the second transistor is between a pair of adjacent source and drain regions, and each gate region of the second transistor comprises polysilicon. The third transistor comprises gate regions and alternating source and drain regions. Each gate region of the third transistor is between a pair of adjacent source and drain regions, and each gate region of the third transistor comprises polysilicon. The contacts cover the polysilicon pads.

In accordance with still another aspect of the present invention, a method of making an RF switch comprises forming a plurality of polysilicon gates on a chip, and forming a plurality of polysilicon pads on the chip so that there is substantially little RF coupling between the polysilicon pads and the polysilicon gates.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
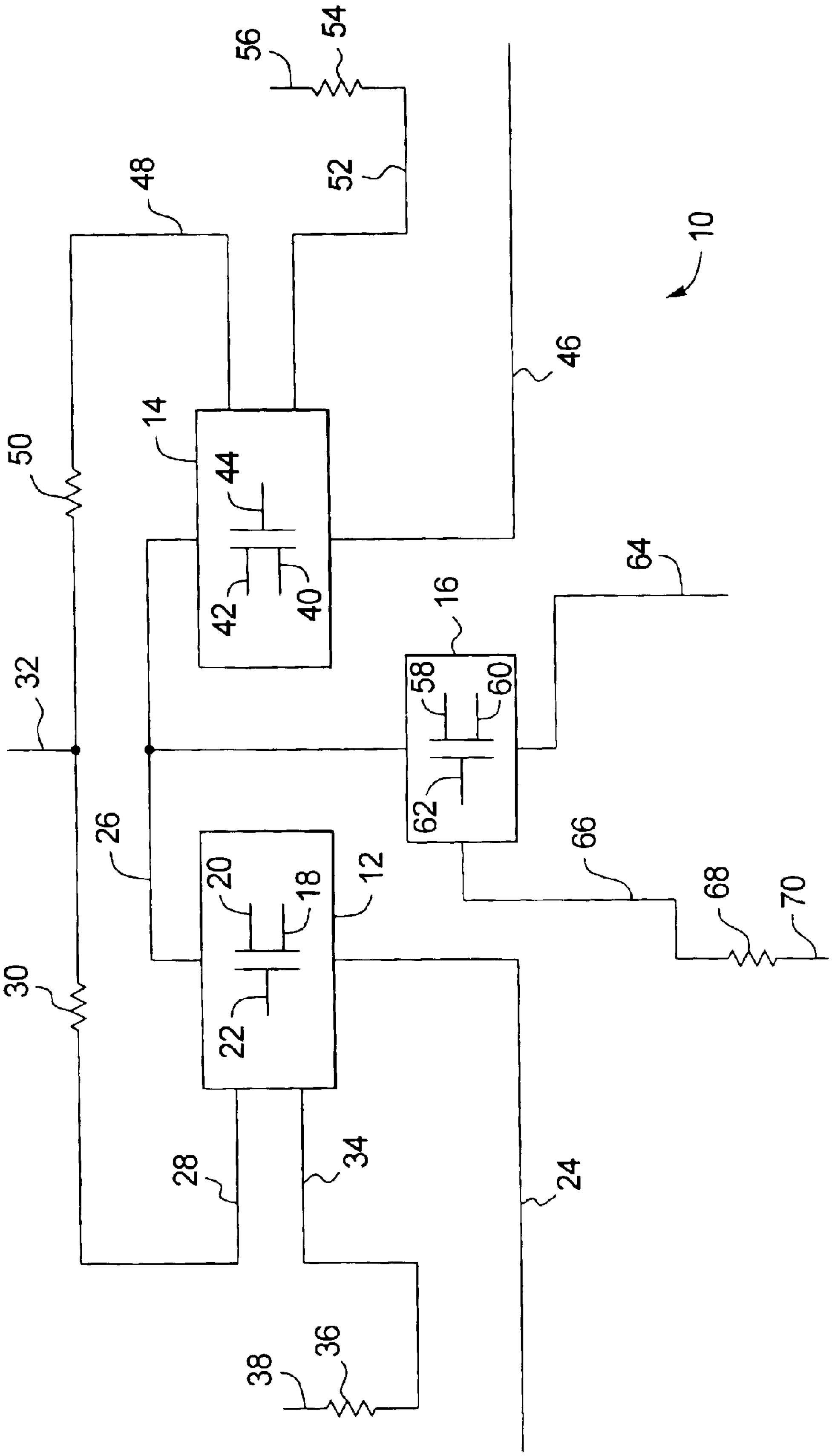
FIG. 1 shows a semiconductor device of a chip according to an embodiment of the present invention.

FIG. 1 shows, in schematic form, a semiconductor device 10 that forms part of a chip. The semiconductor device 10, for example, may comprise an RF switch and, although not shown, the chip may include a silicon substrate as is well known in semiconductor device fabrication. The semiconductor device 10 includes transistors 12, 14, and 16. The transistor 12 has a source 18, a drain 20, and a gate 22. The source 18 is coupled to a metal layer 24, the drain 20 is coupled to a metal layer 26, and the gate 22 is coupled to a metal layer 28. A resistor 30 couples the metal layer 28 to a metal layer 32. The channel of the transistor 12 is coupled to a metal layer 34 which is coupled by a resistor 36 to a metal layer 38.

The transistor 14 has a source 40, a drain 42, and a gate 44. The source 40 is coupled to a metal layer 46, the drain 42 is coupled to the metal layer 26, and the gate 44 is coupled to a metal layer 48. A resistor 50 couples the metal layer 48 to the metal layer 32. The channel of the transistor 14 is coupled to a metal layer 52 which is coupled by a resistor 54 to a metal layer 56.

The transistor 16 has a source 58, a drain 60, and a gate 62. The source 58 is coupled to the metal layer 26, the drain 60 is coupled to a metal layer 64, and the gate 62 is coupled to a metal layer 66. A resistor 68 couples the metal layer 66 to a metal layer 70.

Figure 2:
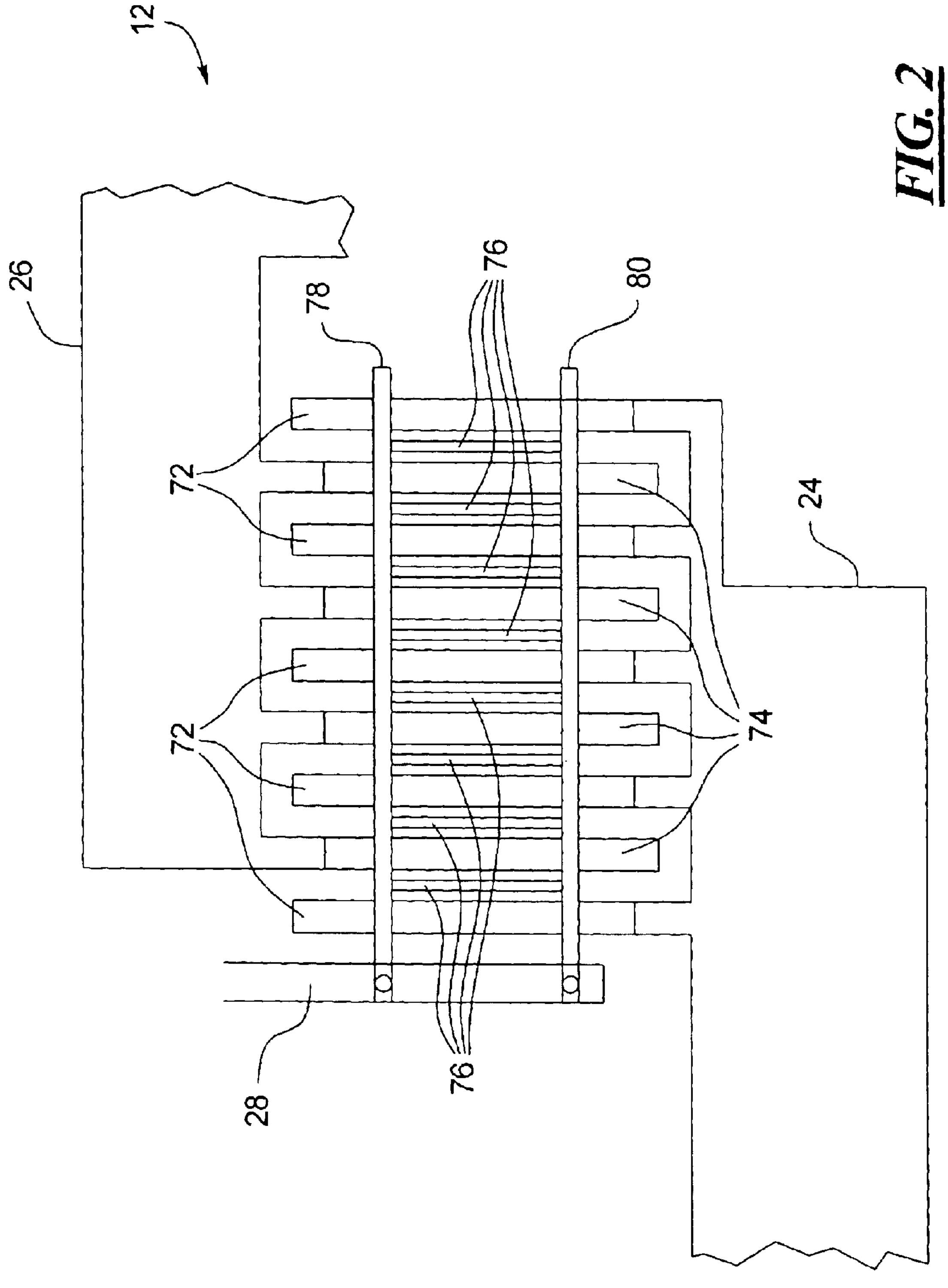
FIG. 2 shows in additional detail a first transistor of the semiconductor device shown in FIG. 1.

As shown in FIG. 2, the source 18 of the transistor 12 comprises a plurality of source regions 72 coupled together by the metal layer 24. Similarly, the drain 20 of the transistor 12 comprises a plurality of drain regions 74 coupled together by the metal layer 26. The source and drain regions 72 and 74 are interleaved as shown in FIG. 2. The gate 22 of the transistor 12 comprises a plurality of polysilicon gate regions 76 coupled together by polysilicon strips 78 and 80, and the polysilicon strips 78 and 80 are coupled to the metal layer 28. Each of the gate regions 76 is between one of the source regions 72 and an adjacent one of the drain regions 74.

Figure 3:
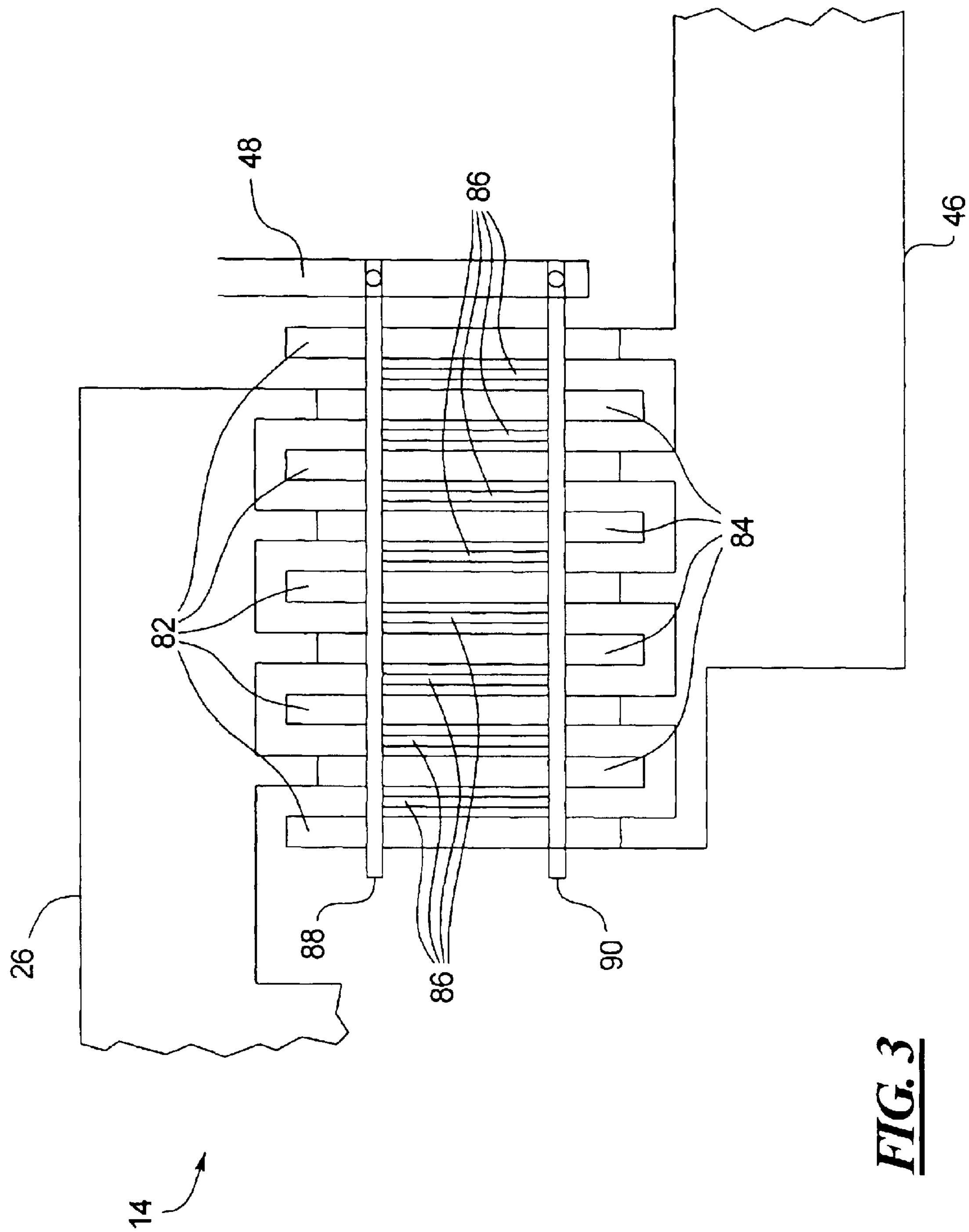
FIG. 3 shows in additional detail a second transistor of the semiconductor device shown in FIG. 1.

As shown in FIG. 3, the source 40 of the transistor 14 comprises a plurality of source regions 82 coupled together by the metal layer 46. Similarly, the drain 42 of the transistor 14 comprises a plurality of drain regions 84 coupled together by the metal layer 26. The source and drain regions 82 and 84 are interleaved as shown in FIG. 3. The gate 44 of the transistor 14 comprises a plurality of polysilicon gate regions 86 coupled together by polysilicon strips 88 and 90, and the polysilicon strips 88 and 90 are coupled to the metal layer 48. Each of the gate regions 86 is between one of the source regions 82 and an adjacent one of the drain regions 84. For clarity, the couplings between the metal layers 34 and 52 and the channels of the corresponding transistors 12 and 14 are not shown in FIGS. 2 and 3.

Figure 4:
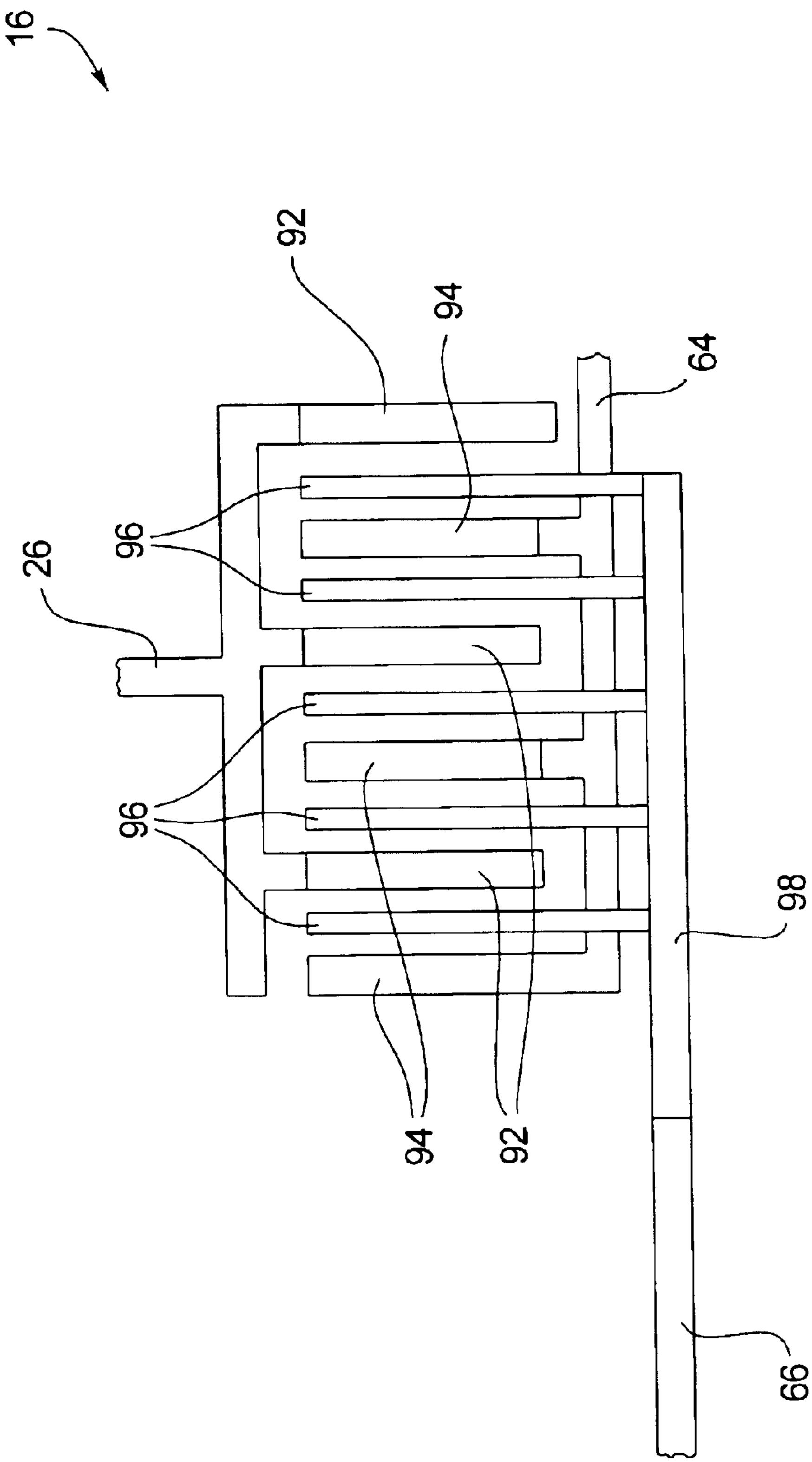
FIG. 4 shows in additional detail a third transistor of the semiconductor device shown in FIG. 1.

As shown in FIG. 4, the source 58 of the transistor 16 comprises a plurality of source regions 92 coupled together by the metal layer 26. Similarly, the drain 60 of the transistor 16 comprises a plurality of drain regions 94 coupled together by the metal layer 64. The source and drain regions 92 and 94 are interleaved as shown in FIG. 4. The gate 62 of the transistor 16 comprises a plurality of polysilicon gate regions 96 coupled together by a polysilicon strip 98, and the polysilicon strip 98 is coupled to the metal layer 66. Each of the gate regions 96 is between one of the source regions 92 and an adjacent one of the drain regions 94.

Figure 5:
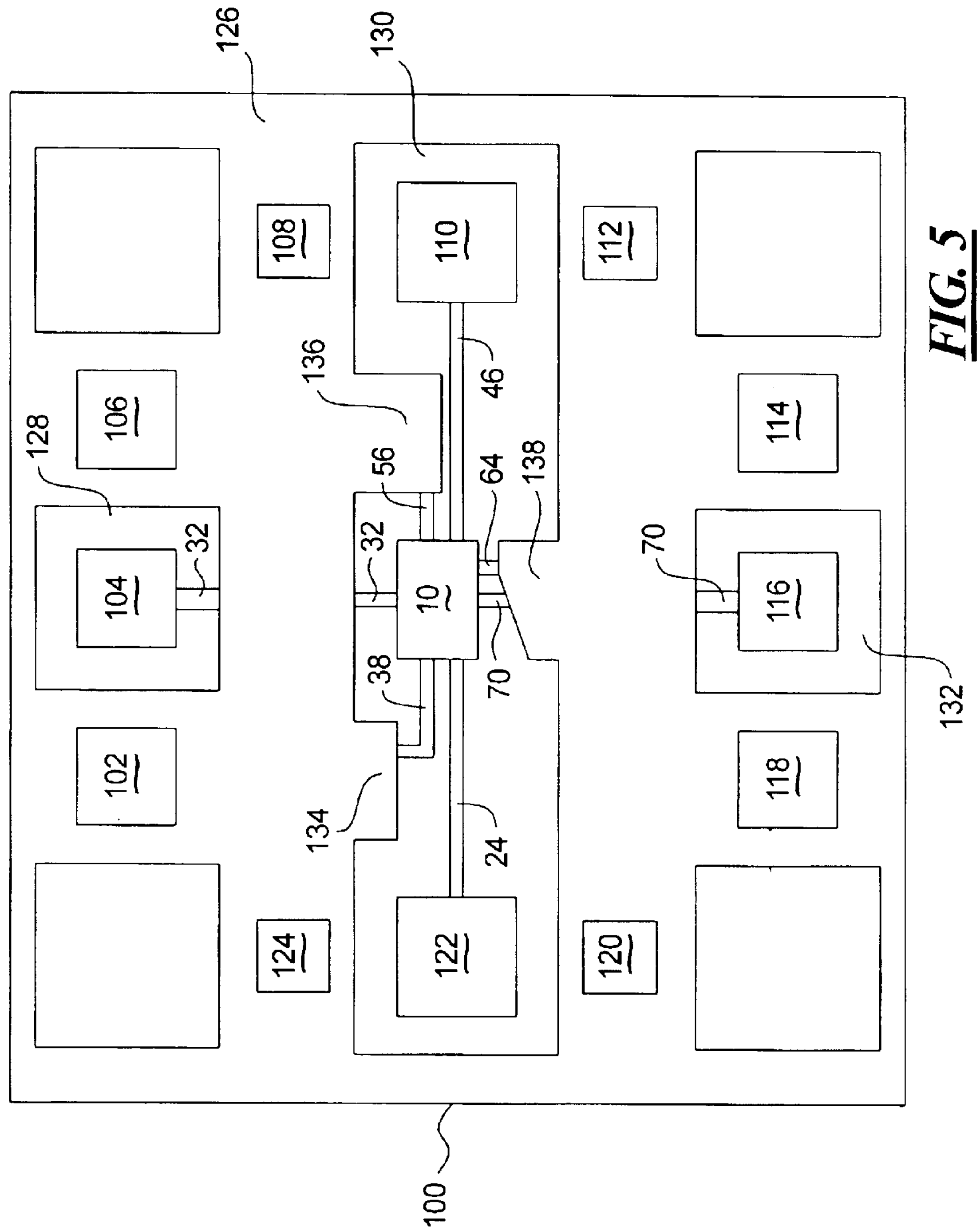
FIG. 5 shows a pad layout for the chip whose semiconductor device is shown in FIG. 1.

As shown in FIG. 5, a pad layout 100 for the chip which includes the semiconductor device 10 comprises probe pads 102, 104, 106, 108, 110, 112, 114, 116, 118, 120, 122, and 124. The probe pads 102, 106, 108, 112, 114, 118, 120, and 124 may be metal and may reside under a metal template 126 which is coupled to a reference potential such as ground. The probe pad 104 resides in a window 128 of the metal template 126, the probe pad 110 resides in a window 130 of the metal template 126, the probe pad 116 resides in a window 132 of the metal template 126, and the probe pad 122 resides in the window 130 of the metal template 126.

Also as shown in FIG. 5, the metal layer 32 extends below the metal template 126 and couples the gates 22 and 44 of the transistors 12 and 14 and the corresponding resistors 30 and 50 to the probe pad 104. The probe pad 104, for example, may function as a control terminal that carries a control signal to the gates 22 and 44 of the transistors 12 and 14. The metal layer 24 extends below the window 130 and couples the source 18 of the transistor 12 to the probe pad 122. The probe pad 122, for example, may function as an input terminal that carries an input signal, such as an input RF signal, to the source 18 of the transistor 12.

The metal layer 46 extends below the window 130 and couples the source 40 of the transistor 14 to the probe pad 110. The probe pad 110, for example, may function as an output terminal that carries an output signal, such as an output RF signal, from the transistor 14. The metal layer 70 extends below the metal template 126 and couples the gate 62 of the transistor 16 and the resistor 68 to the probe pad 116. The probe pad 116, for example, may function as a control terminal that carries a control signal to the gate 62 of the transistor 16.

The metal layer 38 couples the channel of the transistor 12 and the resistor 36 to a portion 134 of the metal template 126. Similarly, the metal layer 56 couples the channel of the transistor 14 and the resistor 54 to a portion 136 of the metal template 126. Finally, the metal layer 64 couples the drain 60 of the transistor 16 to a portion 138 of the metal template 126. The transistors 12, 14, and 16, as well as the resistors 30, 36, 50, 54, and 68, of the semiconductor device 10 are all located within the window 130 of the metal template 126.

Figure 6:
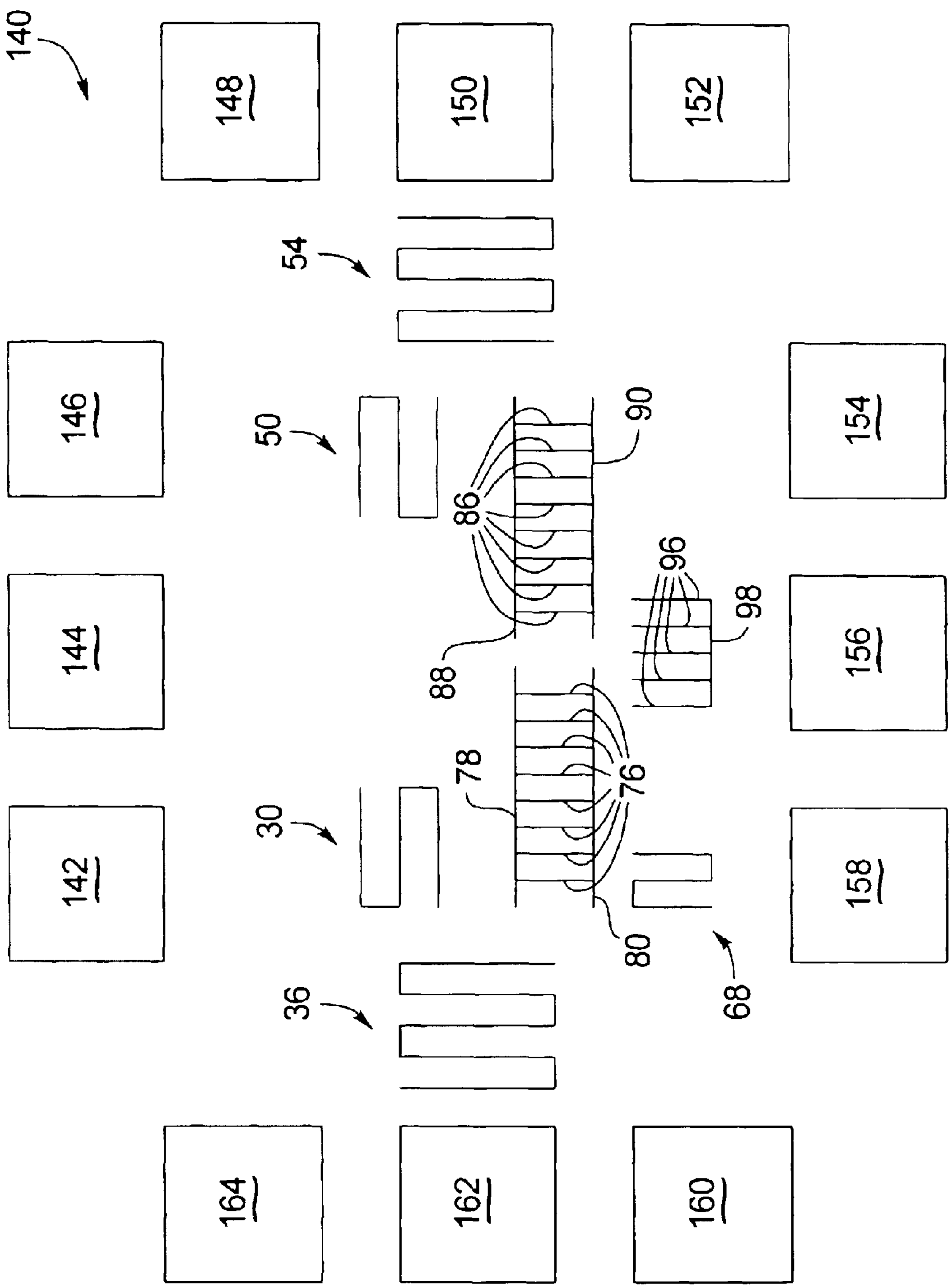
FIG. 6 shows a polysilicon layout for the chip whose semiconductor device is shown in FIG. 1.

FIG. 6 shows a polysilicon layout 140. The polysilicon layout 140 includes (i) the polysilicon gate regions 76 and the polysilicon strips 78 and 80 of the transistor 12, (ii) the polysilicon gate regions 86 and the polysilicon strips 88 and 90 of the transistor 14, and (iii) the polysilicon gate regions 96 and the polysilicon strip 98 of the transistor 16. Additionally, the resistors 30, 36, 50, 54, and 68 are formed of polysilicon strips and, therefore, are also illustrated in the polysilicon layout 140 of FIG. 6. The ends of the polysilicon strips of the resistors 30, 36, 50, 54, and 68 are coupled as shown in order to form the corresponding resistors. Finally, polysilicon pads 142, 144, 146, 148, 150, 152, 154, 156, 158, 160, 162, and 164 are provided in the polysilicon layout 140 of FIG. 6. All of the polysilicon of the polysilicon layout 140 is provided on the substrate of the chip containing the semiconductor device 10.

The polysilicon pad 142 is formed under the probe pad 102, the polysilicon pad 144 is formed under the probe pad 104, the polysilicon pad 146 is formed under the probe pad 106, the polysilicon pad 148 is formed under the probe pad 108, the polysilicon pad 150 is formed under the probe pad 110, the polysilicon pad 152 is formed under the probe pad 112, the polysilicon pad 154 is formed under the probe pad 114, the polysilicon pad 156 is formed under the probe pad 116, the polysilicon pad 158 is formed under the probe pad 118, the polysilicon pad 160 is formed under the probe pad 120, the polysilicon pad 162 is formed under the probe pad 122, and the polysilicon pad 164 is formed under the probe pad 124.

Each of the polysilicon gate regions 76 may have a length of 0.35 $\mu$ with a tolerance of 0.05 $\mu$. As viewed in FIGS. 2 and 6, gate length is the horizontal dimension of each of the gate regions 76. Similarly, each of the polysilicon gate regions 86 may have a length of 0.35 $\mu$ with a tolerance of 0.05 $\mu$, and each of the polysilicon gate regions 96 may have a length of 0.35 $\mu$ with a tolerance of 0.05 $\mu$.

Figure 7:
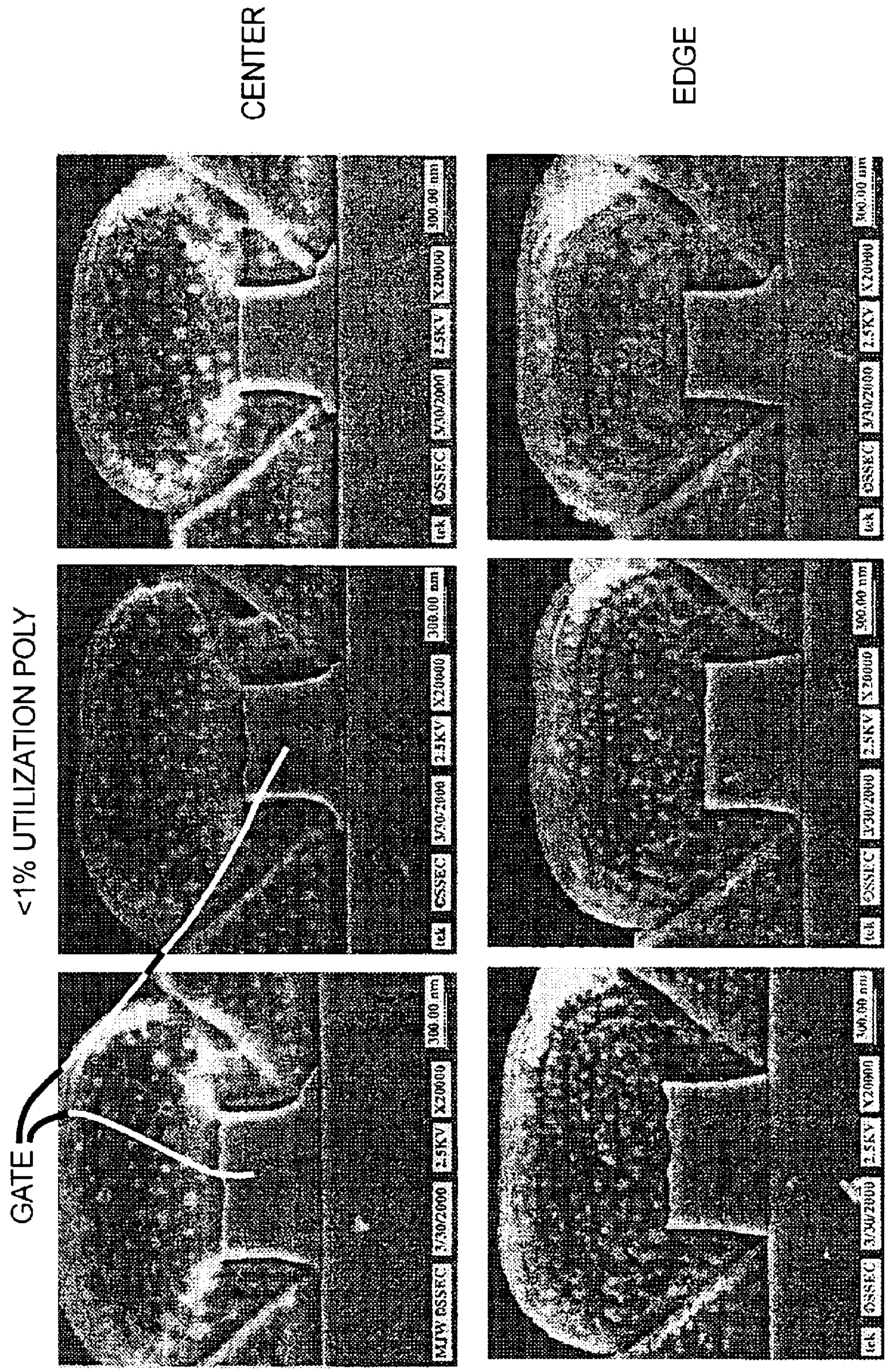
FIG. 7 shows gates following etching when polysilicon pads are not provided on the chip; and, FIG. 8 shows gates following etching when polysilicon pads are provided on the chip.

The polysilicon pads 142, 144, 146, 148, 150, 152, 154, 156, 158, 160, 162, and 164 are provided in order to add additional polysilicon so that the polysilicon gate regions 76, 86, and 96 are formed properly during polysilicon etching. For example, if the area of the chip is commensurate with the metal template 126 shown in FIG. 5, the ratio of the area of the polysilicon gates to the chip area is less than 1%. If these gates provide all of the polysilicon on the chip, the gates would have the appearances shown in FIG. 7 following etching. As can be seen from FIG. 7, the gates do not have vertical walls and, instead, have feet.

Figure 8:
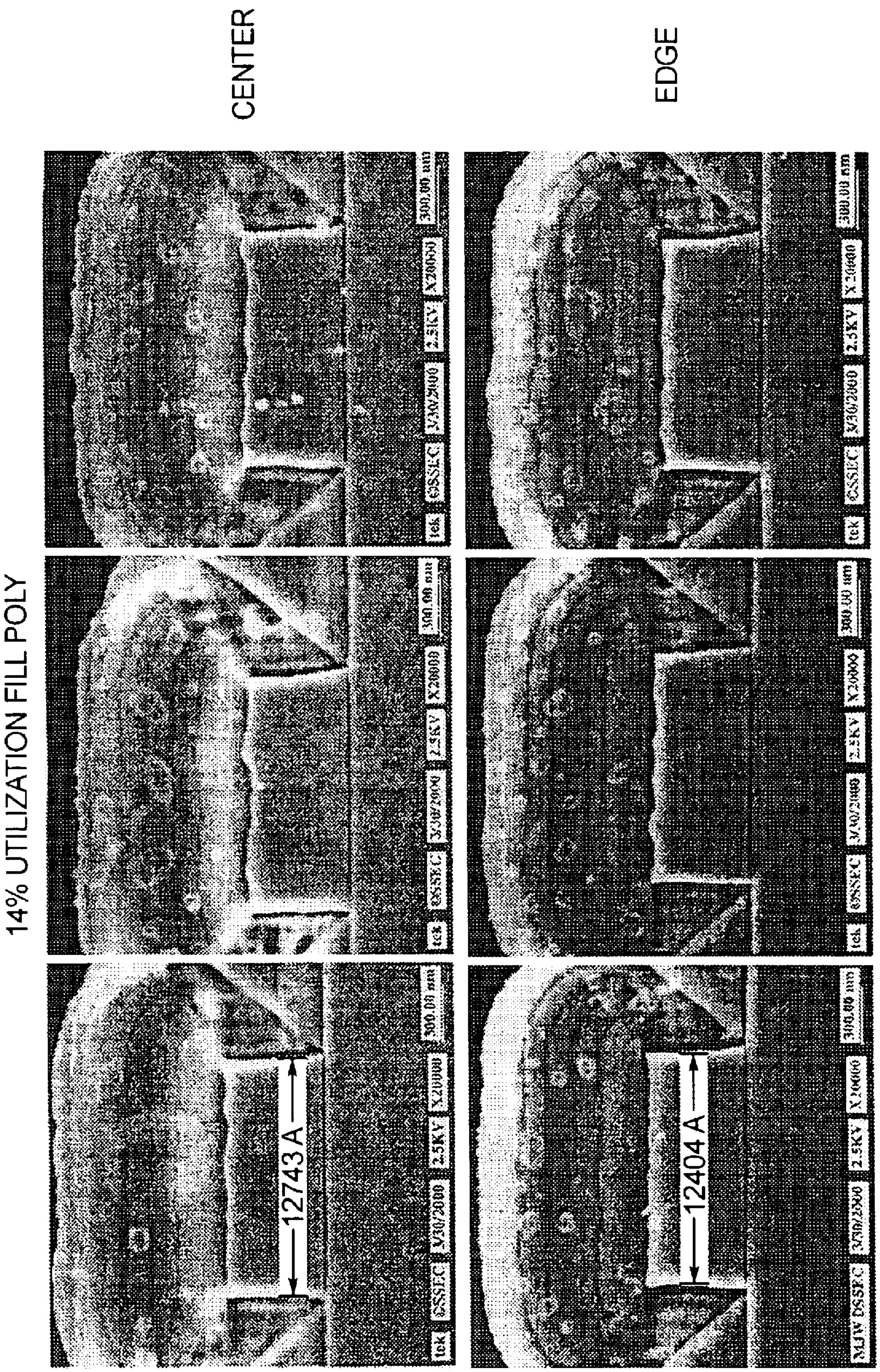

However, the ratio of the area of the polysilicon gates 22, 44, and 62 plus the area of the polysilicon pads 142, 144, 146, 148, 150, 152, 154, 156, 158, 160, 162, and 164 to the chip area is on the order of 14%. As a result, after gate etching, the polysilicon gate regions 76, 86, and 96 will have substantially vertical sides as shown in FIG. 8.

Moreover, by placing the polysilicon pads 142, 144, 146, 148, 150, 152, 154, 156, 158, 160, 162, and 164 under their corresponding probe pads 102, 106, 108, 112, 114, 118, 120, and 124, the polysilicon pads 142, 144, 146, 148, 150, 152, 154, 156, 158, 160, 162, and 164 do no adversely affect the operation of the semiconductor device 10. For example, if the semiconductor device 10 is operated as an RF switch, this placement of the polysilicon pads 142, 144, 146, 148, 150, 152, 154, 156, 158, 160, 162, and 164 results in substantially little RF coupling between the polysilicon of the polysilicon pads 142, 144, 146, 148, 150, 152, 154, 156, 158, 160, 162, and 164 and the polysilicon of the transistors 12, 14, and 16.

Modifications of the present invention will occur to those practicing in the art of the present invention. Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A method of making an RF switch comprising:

forming a plurality of polysilicon gates of at least one semiconductor device on a chip; and, forming a plurality of polysilicon pads on the chip so that there is substantially little RF coupling between the polysilicon pads and the polysilicon gates and so that at least one of the polysilicon pads is on the chip, is located distally from the polysilicon gates, and is unconnected from the semiconductor device.

2. The method of claim 1 wherein the formation of the plurality of polysilicon gates comprises forming a plurality of polysilicon gates each of which is on the order of 0.35 $\mu$ in length.

3. The method of claim 1 wherein the formation of the plurality of polysilicon gates comprises forming a plurality of polysilicon gates that are coupled together by a polysilicon strip, and wherein each of the polysilicon gates is on the order of 0.35 microns in length.

4. The method of claim 1 wherein the formation of the plurality of polysilicon pads comprises forming at least three polysilicon pads, wherein each of the polysilicon pads is covered by a metal pad, wherein a first of the metal pads comprises an RF input of the RF switch, wherein a second of the metal pads comprises an RF output of the RF switch, and wherein a third of the metal pads comprises a control terminal of the RF switch.

5. The method of claim 4 wherein the formation of the polysilicon pads comprises forming at least six polysilicon pads each covered by a metal pad.

6. The method of claim 4 wherein the formation of the polysilicon pads comprises forming at least ten polysilicon pads each covered by a metal pad.

7. The method of claim 1 wherein the chip has an area, and wherein the polysilicon of the pads and gates comprises between 13% and 16% of the area of the chip.

8. The method of claim 7 wherein the polysilicon of the gates comprises less than 1% of the area of the chip.

9. The method of claim 1 wherein the chip has an area, and wherein the polysilicon of the pads and gates comprises substantially 14% of the area of the chip.

10. The method of claim 9 wherein the polysilicon of the gates comprises less than 1% of the area of the chip.

11. The method of claim 1 wherein the formation of a plurality of polysilicon gates on a chip comprises forming at least one transistor on the chip, wherein the transistor further comprises alternating source and drain regions, and wherein each polysilicon gate is between a pair of adjacent source and drain regions.

12. The method of claim 11 further comprising the step of forming at least one polysilicon resistor on the chip.

13. The method of claim 1 wherein the amount of polysilicon in the polysilicon gates and the polysilicon pads permits a polysilicon etch to operate so that the polysilicon gates have substantially vertical walls.

14. A method of making a semiconductor device comprising:

forming polysilicon circuit elements of the semiconductor device on a chip;

forming polysilicon pads of the semiconductor device on the chip, wherein the polysilicon pads are distal from and are unconnected to any of the polysilicon circuit elements; and, covering the polysilicon pads with metal pads.

15. The method of claim 14 wherein each of the polysilicon circuit elements comprise a corresponding polysilicon gate on the order of 0.35 micron in length.

16. The method of claim 14 wherein each of the polysilicon circuit elements comprise a corresponding polysilicon gate, wherein the polysilicon gates are intercoupled, and wherein each of the polysilicon gates is on the order of 0.35 microns in length.

17. The method of claim 14 wherein the chip has an area, wherein the polysilicon pads collectively comprise a first area of the chip, wherein the polysilicon circuit elements collectively comprise a second area of the chip, and wherein the first area of the chip is more than ten times greater that the second area of the chip.

18. The method of claim 14 wherein the chip has an area, wherein the polysilicon pads collectively comprise between 13% and 16% of the area of the chip, and wherein the polysilicon circuit elements collectively comprises 1% or less of the area of the chip.

* * * * *